United States Patent
Chen

(10) Patent No.: US 7,316,571 B1
(45) Date of Patent: Jan. 8, 2008

(54) SUPPORT STRUCTURE OF CIRCUIT MODULE

(75) Inventor: Hung-Chi Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 11/626,982

(22) Filed: Jan. 25, 2007

(30) Foreign Application Priority Data

Sep. 21, 2006 (TW) .............................. 95135014 A

(51) Int. Cl.
*H01R 12/00* (2006.01)
(52) U.S. Cl. ..................... 439/65; 361/719; 361/736; 361/803
(58) Field of Classification Search ................ 439/65; 361/719, 736, 803
See application file for complete search history.

(56) References Cited

U.S. PATENT DOCUMENTS

| | | | | |
|---|---|---|---|---|
| 2,825,037 | A * | 2/1958 | French ..................... | 439/65 |
| 2,875,264 | A * | 2/1959 | Gross ..................... | 174/88 R |
| 3,430,182 | A * | 2/1969 | Blanche ..................... | 439/65 |
| 4,943,242 | A * | 7/1990 | Frankeny et al. ............. | 439/65 |
| 5,102,342 | A * | 4/1992 | Marian ..................... | 439/65 |
| 5,338,207 | A * | 8/1994 | Lineberry et al. ............ | 439/62 |
| 5,796,592 | A * | 8/1998 | Tanaka ..................... | 361/784 |
| 5,871,362 | A * | 2/1999 | Campbell et al. ............. | 439/67 |
| 6,366,473 | B1 * | 4/2002 | Sauer ........................ | 361/818 |
| 6,633,490 | B2 * | 10/2003 | Centola et al. ............. | 361/785 |
| 6,814,583 | B1 * | 11/2004 | Young et al. ................. | 439/65 |
| 7,027,305 | B2 * | 4/2006 | Keating et al. ............. | 361/719 |
| 7,050,303 | B2 * | 5/2006 | Park et al. ................... | 361/715 |

FOREIGN PATENT DOCUMENTS

DE 37 44 190 A1 * 7/1989

* cited by examiner

*Primary Examiner*—Tho D. Ta
(74) *Attorney, Agent, or Firm*—Kirton & McConkie; Evan R. Witt

(57) ABSTRACT

A circuit module includes a printed circuit board, which is vertically mounted on a system circuit board. The support structure includes a first supporting member and a second supporting member. The first supporting member is arranged on a first side of the printed circuit board and includes a first bottom surface lying flat on the system circuit board. The second supporting member is arranged on a second side of the printed circuit board and includes a second bottom surface lying flat on the system circuit board, wherein the second side is opposed to the first side. The first supporting member and the second supporting member cooperatively clamp a lower edge of the printed circuit board therebetween.

17 Claims, 7 Drawing Sheets

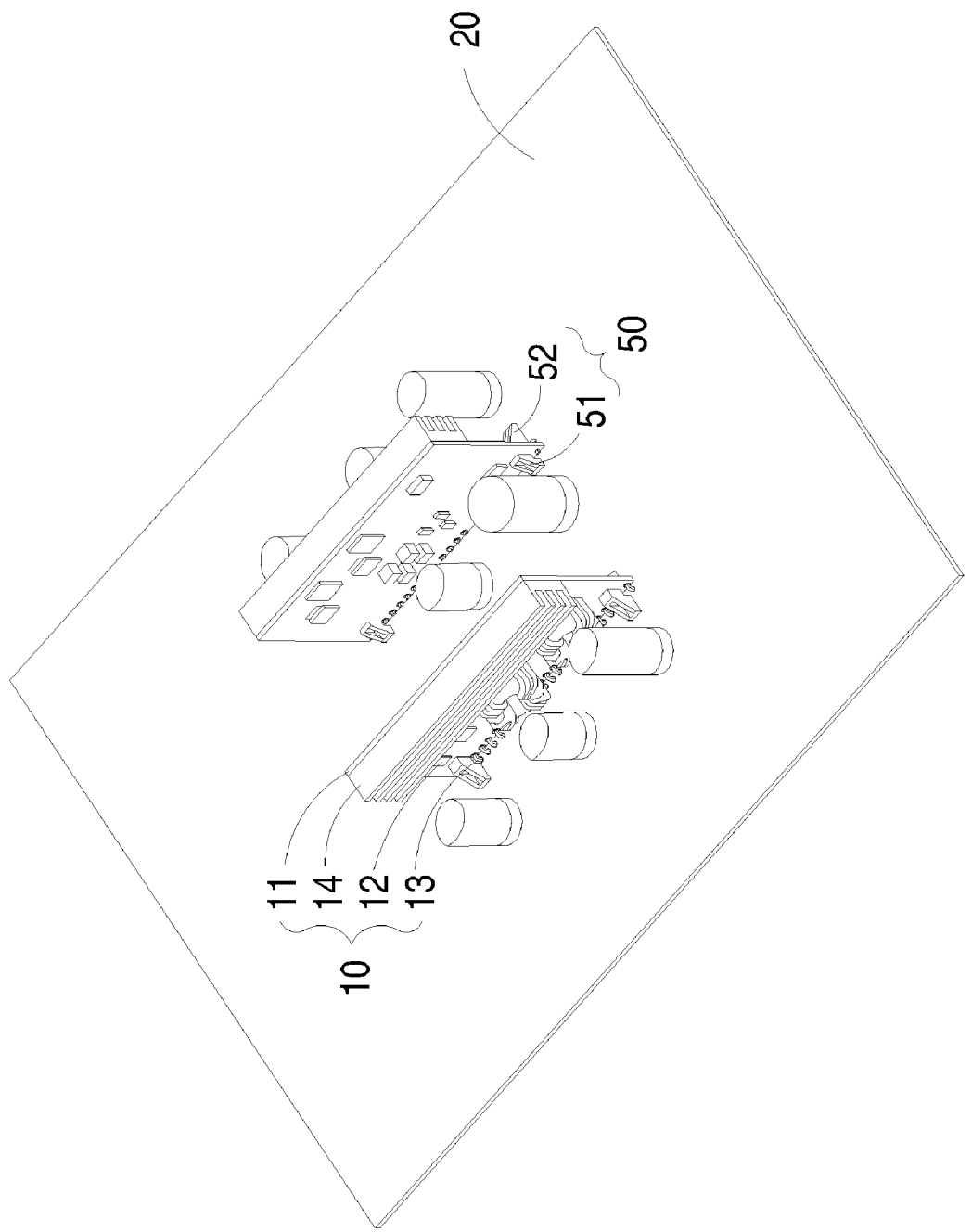

SUPPORT STRUCTURE OF CIRCUIT MODULE

FIELD OF THE INVENTION

The present invention relates to a support structure of a circuit module, and more particularly to a support structure for assisting fixing the circuit module on the system circuit board to avoid rocking the circuit module.

BACKGROUND OF THE INVENTION

With increasing development of electronic industries, the internal circuitries of an electronic device are advanced toward modularization and miniaturization. For example, plural electronic components are mounted on a printed circuit board and thus many functions are integrated into a single circuit module. For example, a power module is a common circuit module. Via an edge connector, the power module is vertically mounted on a system circuit board so as to allow for high-density mounting and increase space utilization of the system circuit board. During the wave soldering process, the power module may be rocked or tilted such that the electronic components on the power module possibly collide with the electronic components on the system circuit board. In this circumstance, the electronic device is possibly short-circuited or even damaged. Therefore, several support structures have been proposed for assisting the power module to be firmly fixed on the system circuit board.

Please refer to FIG. 1, which is a schematic perspective view illustrating a circuit module mounted on a system circuit board. The circuit module is a power module or other functional module. As shown in FIG. 1, the circuit module 10 includes a printed circuit board 11, plural electronic component 12, plural pins 13 and a heat sink 14. The printed circuit board 11 is vertically mounted on a system circuit board 20 so as to allow for high-density mounting and increase space utilization of the system circuit board 20. The pins 13 are protruded from a lower edge of the printed circuit board 11. The pins 13 are inserted into corresponding through-holes 21 in the system circuit board 20 and then welded onto the system circuit board 20 in order to fix the circuit module 10 and permit electrical connection between the printed circuit board 11 and the system circuit board 20.

For assisting the circuit module 10 to be firmly fixed on the system circuit board 20, two of more support pins 13' are inserted into corresponding retaining holes 22 in the system circuit board 20 and then welded onto the system circuit board 20. In addition, since the diameter of the retaining hole 22 is smaller than that of the through-hole 21, the support pins 13' may be tight-fitted into the retaining holes 22 to further facilitate supporting the circuit module 10. The support structure may reduce the possibility of rocking or tilting the circuit module 10 during the wave soldering process. In addition, by means of the support structure, the circuit module 10 will not be uplifted due to the buoyancy of the flux composition and thus the edge side of the circuit module 10 may lie flat on the system circuit board 20. Under this circumstance, the possibility of causing short-circuited or damaged electronic device is reduced. This support structure, however, still has some drawbacks. For example, the support pins 13' fail to be fixed onto the system circuit board 20 due to the poor wetting property and the poor solderability because the diameter of the retaining hole 22 is relatively smaller than that of a standard soldering hole. Since the flux composition is difficulty permeated through the retaining hole 22 to the corresponding contact pad (not shown) on the system circuit board 20, the adhesion between the support pin 13' and the system circuit board 20 is not sufficient. If the height of the circuit module 10 is very high, the circuit module 10 is still tilted.

As shown in FIG. 2, a jig member 30 is used to suppress the circuit module 10 in order to further assist fixing the circuit module 10 on the system circuit board 20 and avoid rocking, tilting or uplifting the circuit module 10. Generally, the jig member 30 comprises a substrate 31 and plural protrusion plates 32. The protrusion plates 32 are perpendicular to the substrate 31. A receiving portion is defined between two adjacent protrusion plates 32. The width of the receiving portion is substantially equal to the width of the circuit module 10 and the upper edge of the circuit module 10 is received in the receiving portion. Since the heights of the electronic components on the circuit module 10 are usually unequal and some electronic components on the system circuit board 20 are arranged beside the circuit module 10, it is difficult to properly place the jig member 30 on the circuit module 10. Moreover, during the process of placing the jig member 30 on the circuit module 10, the electronic components on the circuit module 10 or the system circuit board 20 are readily collided with the circuit module 10 and thus damaged.

In order to further assist fixing the circuit module 10 on the system circuit board 20 and avoid rocking, tilting or uplifting the circuit module 10, a tape 40 is used to confine the circuit module 10 in position. Usually, both ends of the tape 40 are bonded to corresponding electronic components 23 on the system circuit board 20. Since the tape 40 offers poor adhesion, the power module 10 may still be rocked or tilted.

In views of the above-described disadvantages resulted from the prior art, the applicant keeps on carving unflaggingly to develop an improved support structure of a circuit module according to the present invention through wholehearted experience and research.

SUMMARY OF THE INVENTION

It is an object of the present invention to provide a support structure of a circuit module which is vertically mounted on a system circuit board, thereby reducing the possibility of rocking or tilting the circuit module during the wave soldering process and reducing the possibility of causing short-circuited or damaged electronic device.

In accordance with a first aspect of the present invention, there is provided a support structure of a circuit module. The circuit module includes a printed circuit board vertically mounted on a system circuit board. The support structure includes a first supporting member and a second supporting member. The first supporting member is arranged on a first side of the printed circuit board and includes a first bottom surface lying flat on the system circuit board. The second supporting member is arranged on a second side of the printed circuit board and includes a second bottom surface lying flat on the system circuit board, wherein the second side is opposed to the first side. The first supporting member and the second supporting member cooperatively clamp a lower edge of the printed circuit board therebetween.

In an embodiment, the first supporting member and the second supporting member include a first engaging element and a second engaging element, which have complementary shapes.

In an embodiment, the first engaging element is a protrusion post and the second engaging element is an indentation.

In an embodiment, the printed circuit board further includes a perforation corresponding to the protrusion post and the indentation.

In an embodiment, the protrusion post of the first supporting member is penetrated through the perforation of the printed circuit board and then engaged with the indentation.

Preferably, the cross-sections of the protrusion post, the indentation and the perforation are oval-shaped.

Preferably, the cross-sectional areas of the protrusion post, the indentation and the perforation are substantially identical.

In an embodiment, the first bottom surface of the first supporting member and the second bottom surface of the second supporting member are bonded on the system circuit board via adhesive material.

Preferably, the first supporting member and the second supporting member are made of insulating material.

In an embodiment, the circuit module further includes several pins.

In an embodiment, the pins are inserted into corresponding through-holes in the system circuit board and welded onto the system circuit board, thereby permitting electrical connection between the printed circuit board and the system circuit board.

In an embodiment, the first supporting member and the second supporting member are disposed between two adjacent pins.

In an embodiment, the first supporting member and the second supporting member have a first concave portion and a second concave portion so that the first supporting member and the second supporting member are interfered by the pins.

In an embodiment, the circuit module further includes a heat sink.

In an embodiment, the heat sink is mounted on the first side of the printed circuit board, and the first bottom surface of the first supporting member have a larger area than the second bottom surface of the second supporting member.

In an embodiment, the heat sink is mounted on the second side of the printed circuit board, and the second bottom surface of the second supporting member have a larger area than the first bottom surface of the first supporting member.

In an embodiment, the first supporting member and the second supporting member further include ribs for enforcing the first supporting member and the second supporting member.

Preferably, the length of the support structure is less than the width of the circuit module.

Preferably, the circuit module is a power module.

The above contents of the present invention will become more readily apparent to those ordinarily skilled in the art after reviewing the following detailed description and accompanying drawings, in which:

BRIEF DESCRIPTION OF THE DRAWINGS

FIG. 4 is a schematic perspective view illustrating a circuit module mounted on a system circuit board according to a preferred embodiment of the present invention;

DETAILED DESCRIPTION OF THE PREFERRED EMBODIMENT

Figure 1:
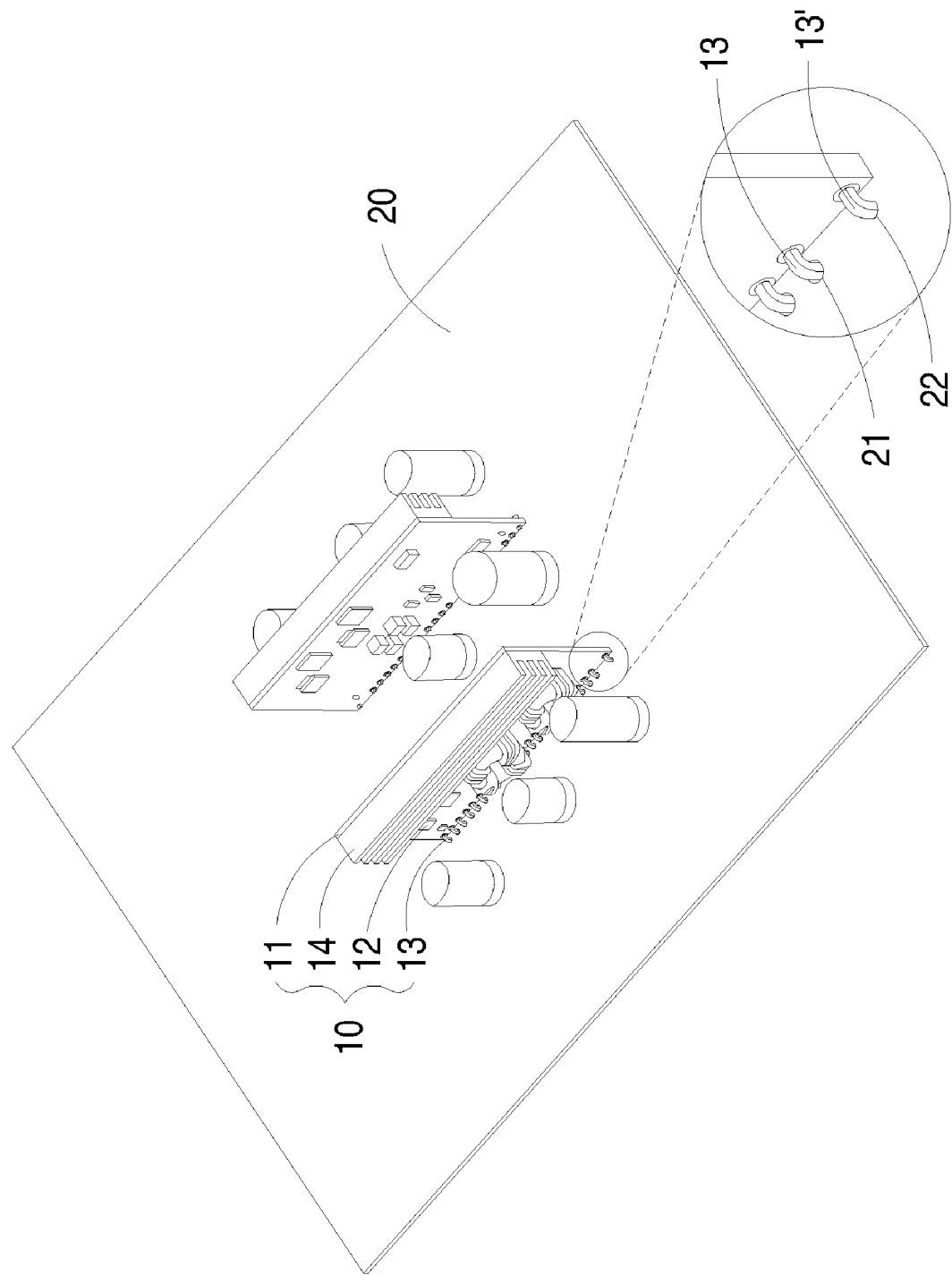
FIG. 1 is a schematic perspective view illustrating a circuit module mounted on a system circuit board according to prior art.
Figure 2:
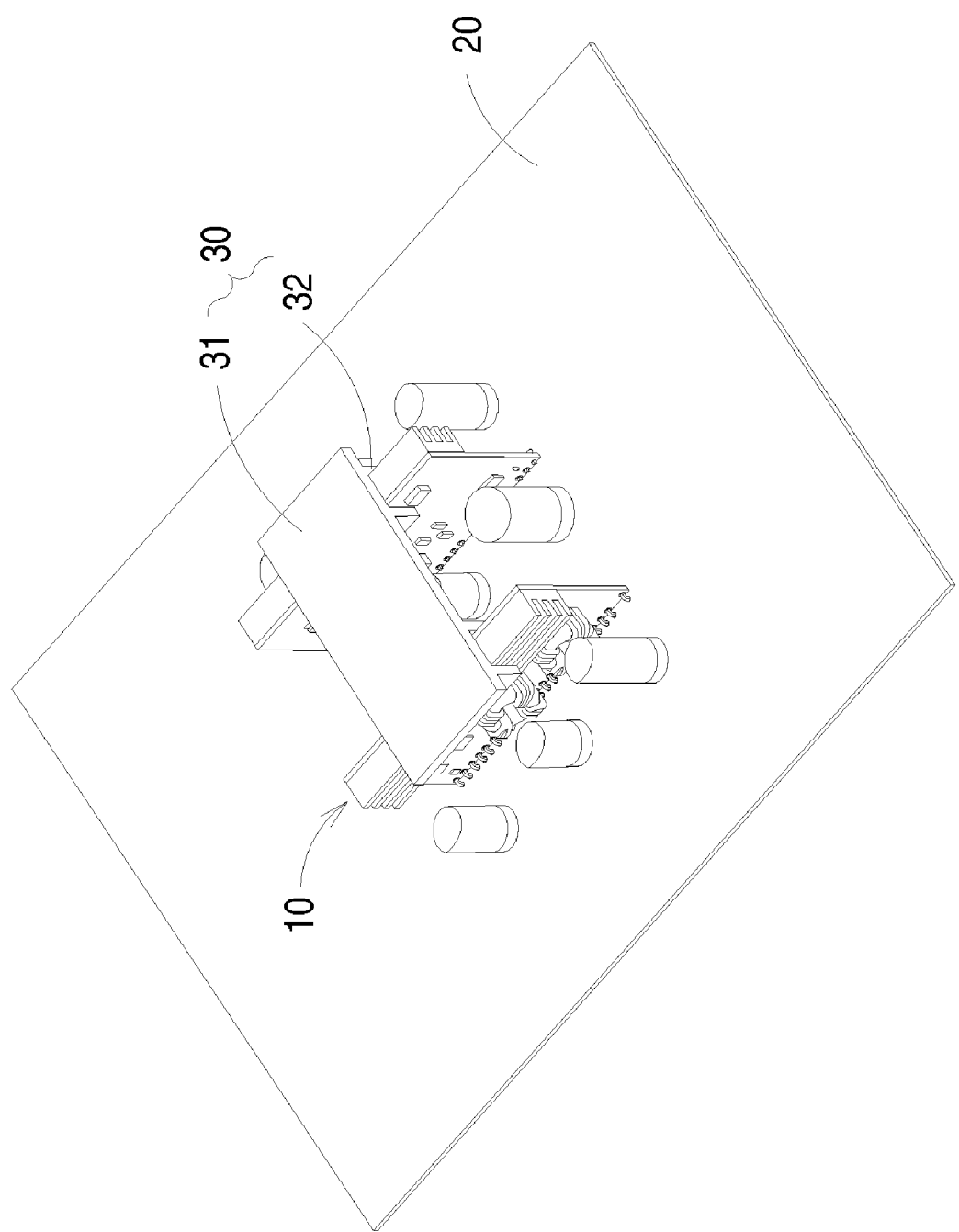
FIG. 2 is a schematic perspective view illustrating a jig member for assist fixing the circuit module on the system circuit board.
Figure 3:
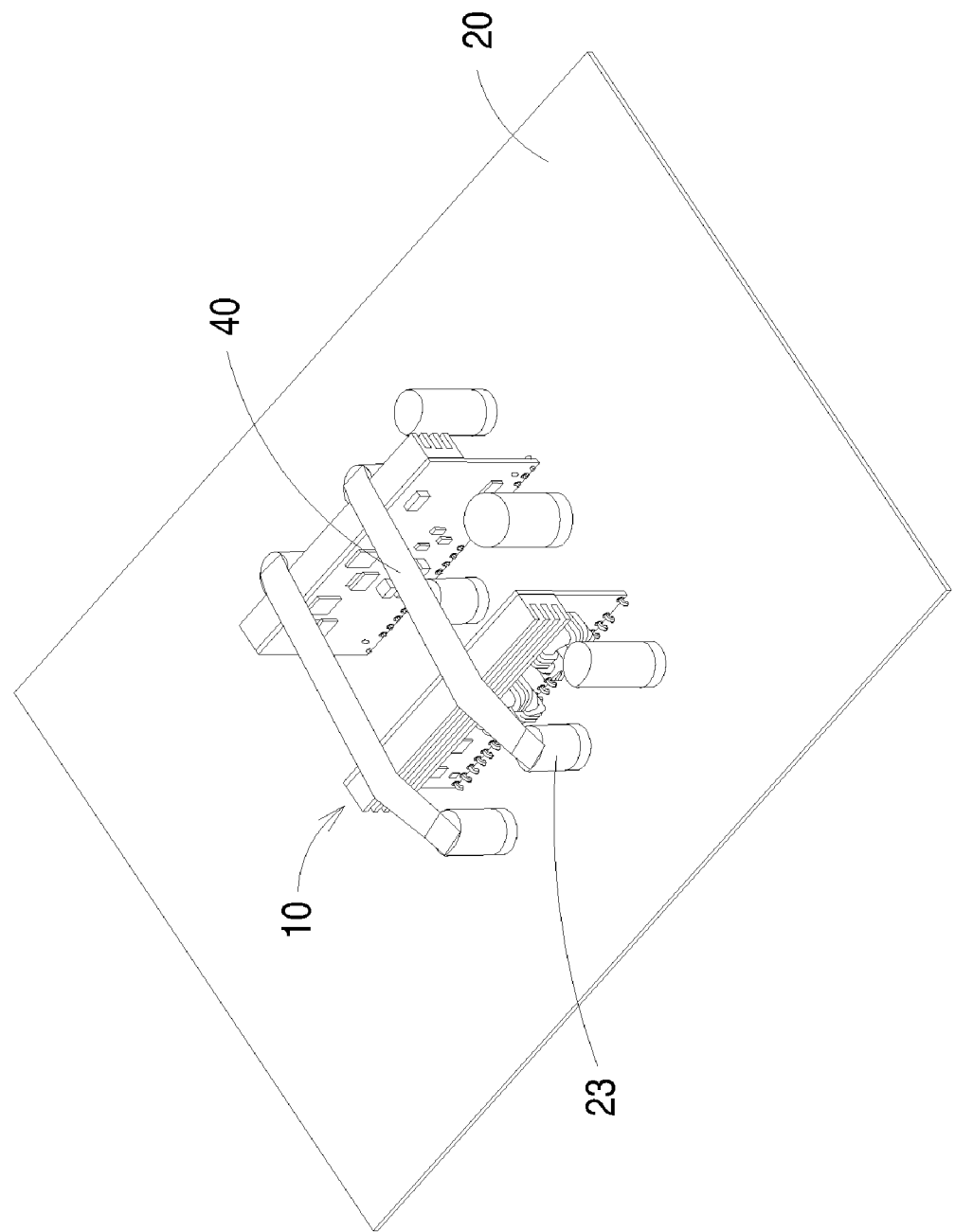
FIG. 3 is a schematic perspective view illustrating a tape for assist fixing the circuit module on the system circuit board.

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Please refer to FIG. 4, which is a schematic perspective view illustrating a circuit module mounted on a system circuit board according to a preferred embodiment of the present invention. The circuit module is a power module or other functional module such as an image processing module or a display module. As shown in FIG. 4, the circuit module 10 includes a printed circuit board 11, plural electronic component 12, plural pins 13 and a heat sink 14. The printed circuit board 11 is vertically mounted on a system circuit board 20 so as to allow for high-density mounting and increase space utilization of the system circuit board 20. The pins 13 are protruded from a lower edge of the printed circuit board 11. The pins 13 are inserted into corresponding through-holes in the system circuit board 20 and then welded onto the system circuit board 20 in order to fix the circuit module 10 and permit electrical connection between the printed circuit board 11 and the system circuit board 20.

As previously described, during the wave soldering process, the power module 10 may be rocked or tilted such that the electronic components on the power module 10 possibly collide with the electronic components on the system circuit board 20 and the electronic device is possibly short-circuited or even damaged. In this embodiment, a support structure 50 is provided for assisting the circuit module 10 to be firmly fixed on the system circuit board 20. The support structure 50 includes a first supporting member 51 and a second supporting member 52. The support structure 50 is made of flame-resistant and thermal-resistant material so as to avoid electromagnetic interference and increase electrical safety.

Figure 5A:
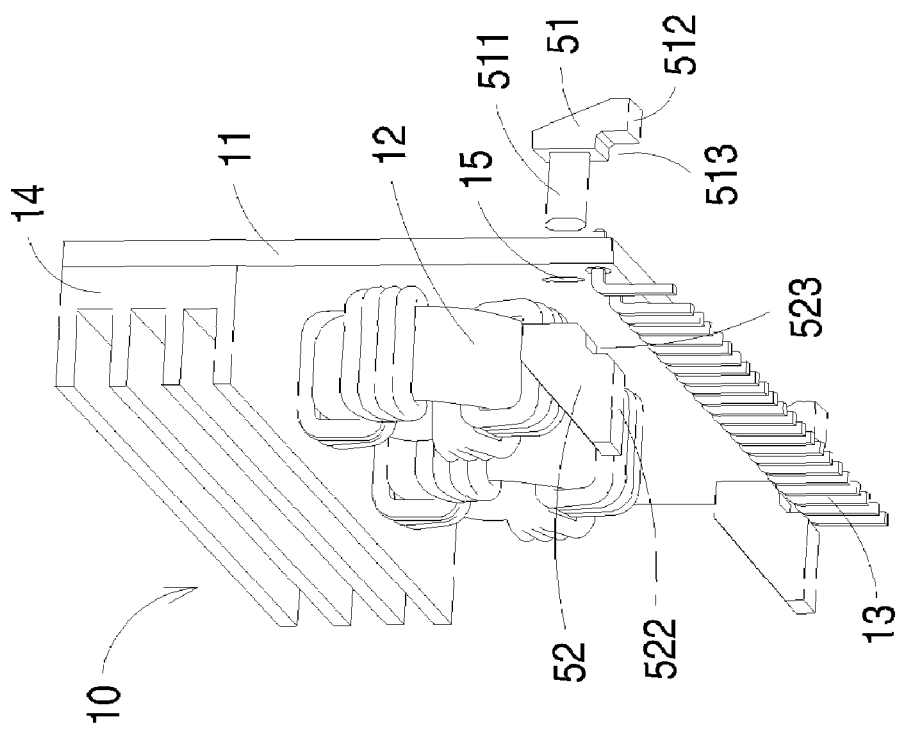
FIGS. 5(a) and 5(b) are schematic assembled views of the support structure.
Figure 5B:
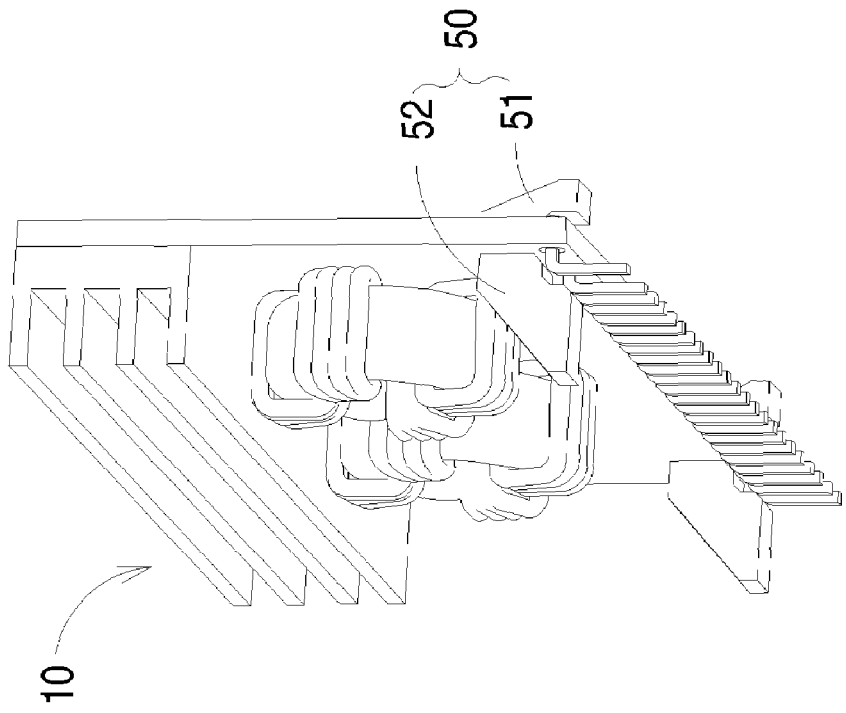
Figure 6B:
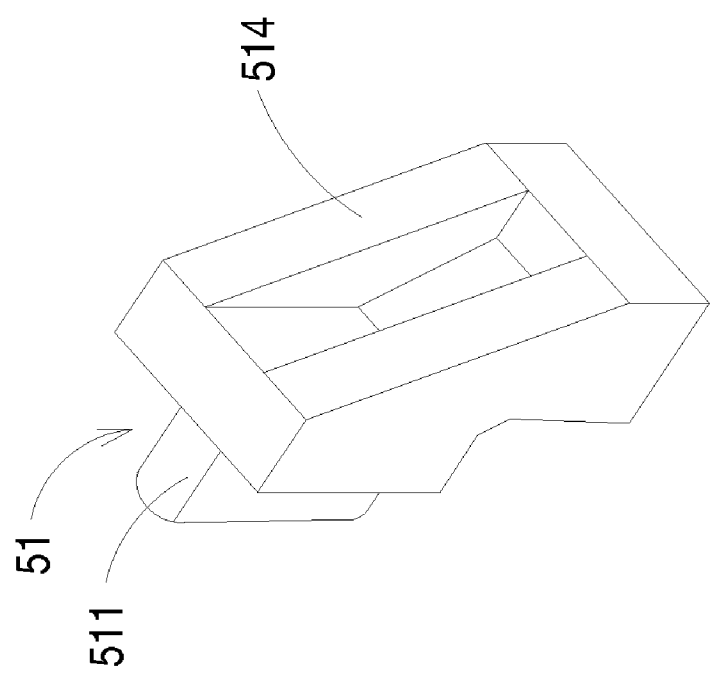
FIGS. 6(a) and 6(b) are schematic perspective views of the support structure.
Figure 6A:
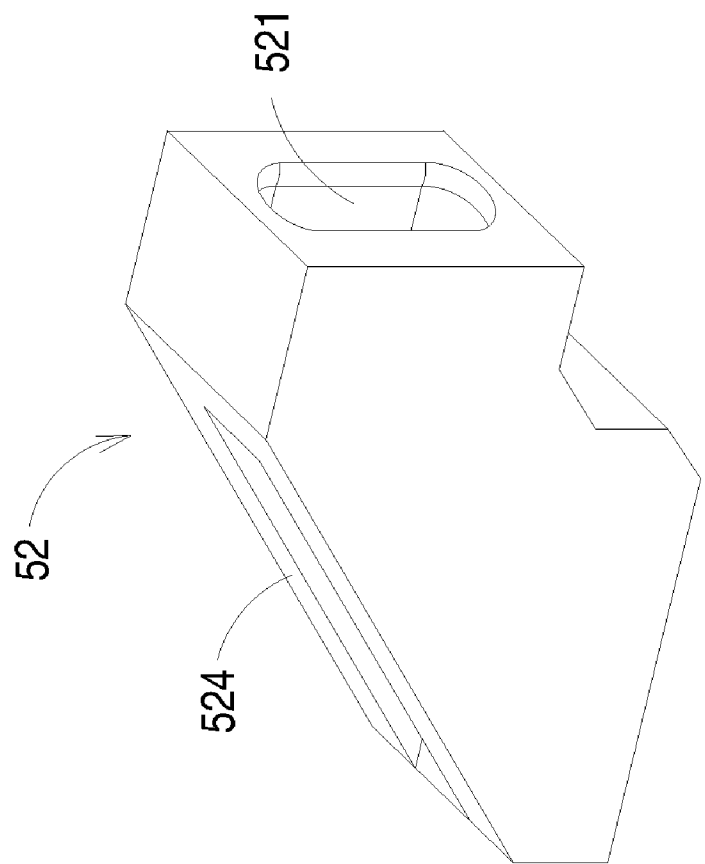

Referring to FIGS. 5(a) and 5(b), schematic assembled views of the support structure are illustrated. As shown in FIG. 5(a), the first supporting member 51 and the second supporting member 52 of the support structure 50 are arranged on opposite sides of the printed circuit board 11. The first supporting member 51 has a protrusion post 511. The second supporting member 52 has an indentation 521 corresponding to the protrusion post 511 of the first supporting member 51, as is also shown in FIGS. 6(a) and 6(b). The printed circuit board 11 has a perforation 15 corresponding to the protrusion post 511 of the first supporting member 51 and the indentation 521 of the second supporting member 52. The cross-sectional areas of the protrusion post 511, the indentation 521 and the perforation 15 are substantially identical, so that the protrusion post 511 is tight-fitted into the perforation 15 and the indentation 521. For coupling the support structure 50 with the circuit module 10, the protrusion post 511 of the first supporting member 51 is penetrated through the perforation 15 of the printed circuit board 11 and then fastened into the indentation 521 of the second supporting member 52. Meanwhile, the lower edge of the printed circuit board 11 is clamped by the first supporting member 51 and the second supporting member 52, as can be seen in FIG. 5(b). Moreover, the first supporting member 51 and the second supporting member 52 include a first bottom surface 512 and a second bottom surface 522, respectively, so that the first supporting member 51 and the second supporting member 52 may lie flat on the system circuit board 20. By means of the first supporting member 51 and the second supporting member 52, the circuit module 10 will be securely fixed on the system circuit board 20 so as to avoid rocking, tilting or uplifting the circuit module 10.

In some embodiment, the cross-sections of the protrusion post 511, the indentation 521 and the perforation 15 are oval-shaped. Due to the oval-shaped cross-sections, the first supporting member 51 and the second supporting member 52 will not be rotated when the protrusion post 511 is tight-fitted into the perforation 15 and the indentation 521. It is noted that, however, those skilled in the art will readily observe that numerous modifications and alterations of the support structure 50 may be made while retaining the teachings of the invention. For example, the cross-sections of the protrusion post 511, the indentation 521 and the perforation 15 may have arbitrary shapes. In addition, the numbers of the protrusion posts 511, the perforations 15 and the indentations 521 are not limited so long as the protrusion posts 511 are tight-fitted into the perforations 15 and the indentations 521. For example, the first supporting member 51 has two or more protrusion posts 511, and the second supporting member 52 has identical numbers of indentations 521. The locations of the protrusion post and the indentation may be exchanged. Moreover, the protrusion post and the indentation may be replaced by other fastening means.

Figure 7:
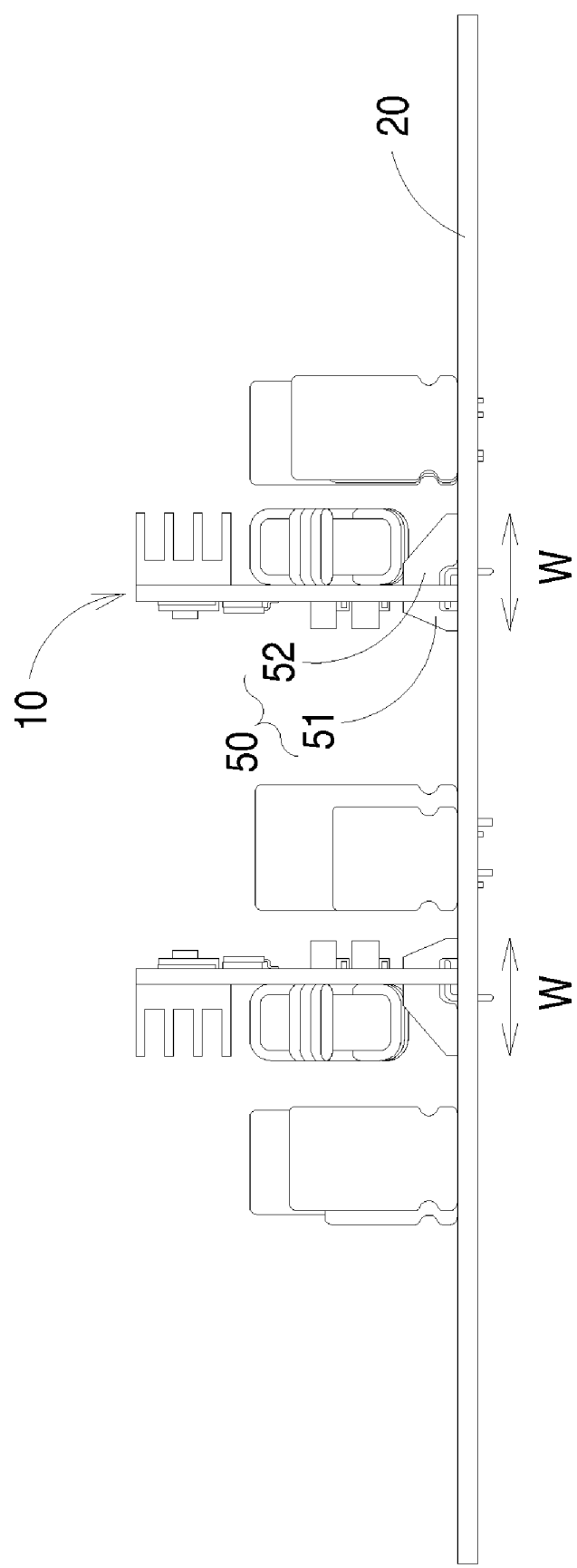
FIG. 7 is a schematic layout view of the system circuit board.

In some embodiments, the first supporting member 51 and the second supporting member 52 have a first concave portion 513 and a second concave portion 523 in the vicinity of the printed circuit board 11 and the system circuit board 20. Due to the first concave portion 513 and a second concave portion 523, the first supporting member 51 and the second supporting member 52 will not be interfered by the pins 13, as can be seen in FIGS. 5(b) and 7. In a case that the support structure 50 is not adjacent to the pins 13, the first concave portion 513 and a second concave portion 523 may be dispensed with. For example, the first supporting member 51 and the second supporting member 52 may be disposed between two adjacent pins.

Please refer to FIGS. 5(a) and 5(b) again. Since most electronic components 12 and the heat sink 14 are mounted on a second side of the printed circuit board 11, the center-of-gravity position may render the circuit module 10 to tilt toward the second side. As a consequence, the second bottom surface 522 of the second supporting member 52 should be designed to have a larger area than the first bottom surface 512 of the first supporting member 51 so as to increase the supporting effect in the second side. Similarly, if the heat sink 14 is mounted on the first side of the printed circuit board 11, the first bottom surface 512 should be designed to have a larger area than the second bottom surface 522.

In some embodiments, the first bottom surface 512 of the first supporting member 51 and the second bottom surface 522 of the second supporting member 52 may be applied with adhesive material, so that the first supporting member 51 and the second supporting member 52 may be securely bonded on the system circuit board 20. Under this circumstance, the circuit module 10 will not be uplifted due to the buoyancy of the flux composition.

In some embodiments, as shown in FIGS. 6(a) and 6(b), the first supporting member 51 and the second supporting member 52 further include ribs 514 and 524 for enforcing the first supporting member 51 and the second supporting member 52.

Referring to FIG. 7, a schematic layout view of the system circuit board is illustrated. The length of the support structure 50 is preferably less than the width W of the circuit module 10. That is, since the support structure 50 will not collide with the electronic components on the system circuit board 20, the layout configuration of the system circuit board 20 needs not be changed. As a consequence, no additional cost is required to adjust the layout configuration of the system circuit board 20.

In the above embodiments, due to the bottom surfaces 512 and 522, the contact area between the support structure 50 and the circuit module 10 is increased and the support structure 50 lies flat on the system circuit board 20. The protrusion post 511 and the indentation 521 have complementary shapes so as to be tight-fitted with each other. Alternatively, the first supporting member 51 and the second supporting member 52 may be individually coupled to the printed circuit board 11. For example, the first supporting member 51 and the second supporting member 52 may have individual protrusion posts coupled to corresponding perforations of the printed circuit board 11. Alternatively, the first supporting member 51 and the second supporting member 52 are in contact with the printed circuit board 11 but the bottom surfaces thereof are bonded on the system circuit board 20 via adhesive material or other fastening means.

From the above description, the first supporting member and the second supporting member of the support structure are arranged on opposite sides of the printed circuit board so as to clamp the circuit module therebetween. In addition, since the first supporting member and the second supporting member have flat bottom surfaces, the first supporting member and the second supporting member may lie flat on the system circuit board. The support structure of the present invention may reduce the possibility of rocking or tilting the circuit module during the wave soldering process. Under this circumstance, the possibility of causing short-circuited or damaged electronic device is reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A support structure of a circuit module, said circuit module including a printed circuit board vertically mounted on a system circuit board and a plurality of pins, said support structure comprising:

a first supporting member arranged on a first side of said printed circuit board and including a first bottom surface lying flat on said system circuit board; and a second supporting member arranged on a second side of said printed circuit board and including a second bottom surface lying flat on said system circuit board, wherein said second side is opposed to said first side, wherein said first supporting member and said second supporting member cooperatively clamp a lower edge of said printed circuit board therebetween and respectively have a first concave portion and a second concave portion to dispose said pins therein so that said first supporting member and said second supporting member are not interfered by said pins.

2. The support structure according to claim 1 wherein said first bottom surface of said first supporting member and said second bottom surface of said second supporting member are bonded on said system circuit board via adhesive material.

3. The support structure according to claim 1 wherein said first supporting member and said second supporting member are made of insulating material.

4. The support structure according to claim 1 wherein said pins are inserted into corresponding through-holes in said system circuit board and welded onto said system circuit board, thereby permitting electrical connection between said printed circuit board and said system circuit board.

5. The support structure according to claim 1 wherein said first supporting member and said second supporting member are disposed adjacent to at least one of said pins.

6. The support structure according to claim 1 wherein said first supporting member and said second supporting member further include ribs for enforcing said first supporting member and said second supporting member.

7. The support structure according to claim 1 wherein the length of said support structure is less than the width of said circuit module.

8. The support structure according to claim 1 wherein said circuit module is a power module.

9. The support structure according to claim 1 wherein said first supporting member and said second supporting member include a first engaging element and a second engaging element, which have complementary shapes.

10. The support structure according to claim 9 wherein said first engaging element is a protrusion post and said second engaging element is an indentation.

11. The support structure according to claim 10 wherein said printed circuit board further includes a perforation corresponding to said protrusion post and said indentation.

12. The support structure according to claim 11 wherein said protrusion post of said first supporting member is penetrated through said perforation of said printed circuit board and then engaged with said indentation.

13. The support structure according to claim 12 wherein the cross-sections of said protrusion post, said indentation and said perforation are oval-shaped.

14. The support structure according to claim 12 wherein the cross-sectional areas of said protrusion post, said indentation and said perforation are substantially identical.

15. The support structure according to claim 1 wherein said circuit module further includes a heat sink.

16. The support structure according to claim 15 wherein said heat sink is mounted on said first side of said printed circuit board, and said first bottom surface of said first supporting member have a larger area than said second bottom surface of said second supporting member.

17. The support structure according to claim 15 wherein said heat sink is mounted on said second side of said printed circuit board, and said second bottom surface of said second supporting member have a larger area than said first bottom surface of said first supporting member.

* * * * *